US011429129B2

(12) United States Patent
Howard et al.

(10) Patent No.: US 11,429,129 B2
(45) Date of Patent: Aug. 30, 2022

(54) MULTI-DECK CIRCUITS WITH COMMON RAILS

(71) Applicant: Sensata Technologies, Inc., Attleboro, MA (US)

(72) Inventors: Neil J. Howard, Marlborough (GB); Davide Bianchi, Marlborough (GB)

(73) Assignee: Sensata Technologies, Inc., Attleboro, MA (US)

( * ) Notice: Subject to any disclaimer, the term of this patent is extended or adjusted under 35 U.S.C. 154(b) by 86 days.

(21) Appl. No.: 15/930,817

(22) Filed: May 13, 2020

(65) Prior Publication Data

US 2021/0356980 A1 Nov. 18, 2021

(51) Int. Cl.
| G05F 1/46 | (2006.01) |
| G05F 1/585 | (2006.01) |
| H03K 19/00 | (2006.01) |
| G05F 1/577 | (2006.01) |
| G05F 1/575 | (2006.01) |

(52) U.S. Cl.
CPC .............. *G05F 1/585* (2013.01); *G05F 1/46* (2013.01); *G05F 1/462* (2013.01); *G05F 1/465* (2013.01); *G05F 1/575* (2013.01); *G05F 1/577* (2013.01); *H03K 19/0013* (2013.01)

(58) Field of Classification Search
CPC ... G05F 1/585; G05F 1/46; G05F 1/56; G05F 1/462; G05F 1/465; G05F 1/575; G05F 1/577; G05F 1/613; G05F 1/61; G05F 1/618; G05F 3/08; G05F 3/02; H03K 19/0013; G06F 1/26
See application file for complete search history.

(56) References Cited

U.S. PATENT DOCUMENTS

| 11,095,216 B2* | 8/2021 | Lo ........................... H02M 1/00 |
| 2010/0141223 A1 | 6/2010 | Wadhwa |
| 2012/0032655 A1 | 2/2012 | Ramaraju |
| 2014/0239719 A1 | 8/2014 | Kumar |
| 2014/0344589 A1 | 11/2014 | Muthukaruppan |
| 2018/0233903 A1 | 8/2018 | Murakami |

OTHER PUBLICATIONS

International Search Report and Written Opinion issued in PCT/US2021/031191 dated Aug. 2, 2021.

* cited by examiner

*Primary Examiner* — Jung Kim
(74) *Attorney, Agent, or Firm* — Mark H. Whittenberger, Esq.; Holland & Knight LLP

(57) ABSTRACT

A multi-deck circuit arrangement including a first deck circuit having a negative supply terminal and a second deck having a positive supply terminal connected to the negative supply terminal. A single power supply provides a voltage across both the first and second decks. The total power consumption will be less than the prior art of having both deck circuits conventionally regulated. The supply rail connecting the second deck's positive supply terminal to the first deck's negative supply terminal may be regulated. In one embodiment, the rail voltage can be controlled to optimize deck circuit operation for speed and power and to avoid level shifters when interfacing to other circuits.

10 Claims, 8 Drawing Sheets

US 11,429,129 B2

MULTI-DECK CIRCUITS WITH COMMON RAILS

TECHNICAL FIELD

An electrical circuit having multiple decks in which a negative terminal of an upper deck and a supply terminal of a lower deck are both connected to the same common rail.

BACKGROUND

Traditional Single Deck Circuits

A traditional single deck circuit arrangement 600 is shown in FIG. 6. The single deck circuit arrangement 600 includes an electrical circuit 602 powered from a voltage source 604 by a positive supply terminal 606 of the voltage source 604 connecting to a positive supply terminal 608 of the circuit 602 and a negative supply terminal 610 of the voltage source 604 connecting to a negative supply terminal 612 of the circuit 602. The single deck circuit arrangement 600 also includes wires or rails 620, 622 that connect supply terminals so that components hang off the upper rail 620. Depending upon the functionality, the circuit 602 may have various input signal and/or output signals.

The single deck circuit arrangement 600 also includes a voltage regulator arrangement 630. The voltage regulator arrangement 630 generates a lower output voltage (Vreg) at output terminal 632. Voltage Vreg is lower than the positive voltage (Vpos) at supply terminal 606 and on the rail 620. The voltage regulator arrangement 630 includes a voltage regulator 634 powered through a first positive supply terminal 636 connected to the rail 620. The voltage regulator arrangement 630 also has a pass transistor 638 that is connected in series with a second circuit 640. The voltage regulator 634 controls how much current passes through this transistor 638 by adjusting a control signal 5642 in order to keep the voltage Vreg at the output 632 constant. Thus, voltage Vreg is a fixed voltage on the positive supply terminal 642 of the second circuit 640.

Battery Life

Battery-powered Internet of Things (IoT) sensors, such as an application-specific integrated circuit (ASIC) for a tire pressure monitor, requires low power consumption to achieve longer battery life. One approach to achieve this low power consumption is to use DC-to-DC converters to step-down the battery voltage (e.g., 3V) to a lower voltage (e.g., 1V). However, this approach requires large capacitors or inductors. Integrating the capacitors and inductors into integrated circuits can be expensive and/or cumbersome as external discrete components. Further, the DC-to-DC converters are not efficient for low currents.

Leakage Current and Filler Capacitors

FIG. 4 shows an example of a CMOS circuit 400. CMOS circuit 400 includes an input terminal 402 and an output terminal 404. CMOS circuit 400 also includes two transistors, namely P-channel MOSFET 406 and N-channel MOSFET 408, each having four terminals. The four terminals of the P-channel MOSFET 406 are gate 410, source 412, drain 416, and body 418. The four terminals of N-channel MOSFET 408 include gate 420, source 422, drain 424, and body 426. In one embodiment, body 418 is connected to rail 440 and body 426 is connected to rail 442.

When a power supply is connected between supply rail 440 and ground rail 442, current flows from supply rail 440 to ground rail 442 through transistors 406, 408 even when circuit 400 is in a static mode. In a static mode, this current flow is referred to as source-drain leakage current, which can undesirably drain battery life. Further, filler cell 450 may include one or more decoupling capacitors to smooth out fluctuations of the supply voltage and potentially reduce overall consumption from the regulator circuit.

Voltage Regulation

Referring now to FIG. 7, a block diagram showing a traditional circuit arrangement 700 for providing voltage regulation in accordance with the subject technology. The voltage regulation arrangement 700 has a power supply 702 such as a 3V battery with a positive supply terminal 704 and a negative supply terminal 706. The power supply 702 can directly power a circuit 708. However, a second circuit 710 may require a different supply voltage via the positive supply terminal 712 of the second circuit 710.

A voltage regulator 720 produces the required different voltage such as 1V. The voltage regulator 720 may be a DC linear regulator in which the current out $I_{720}$ is approximately the same as the current in $I_{718}$. The efficiency of the voltage regulator 720 can be very low. For example, the efficiency of a 1V voltage regulator supply by 3V is only 33% with 67% of the power dissipated as heat within the voltage regulator. The efficiency improves if the voltage regulator is a DC-DC converter but DC-DC converters are more complex than DC linear regulators and difficult to integrate in an integrated circuit.

Still referring to FIG. 7, in order for the circuits 708, 710 to interact, level shifter cells 730 can shift the voltage level of a first circuit output terminal 732 to a required input level for a second circuit input terminal 734. A level shifter cell is a circuit through which a circuit powered by one voltage source can transfer a signal to a second powered by a second voltage source. The level shifter shifts the voltages that indicate respectively a logic '0' and a logic '1' in the first circuit to levels for the second circuit. It would be an improvement to alleviate the need for a level shifter.

SUMMARY

In view of the above, a need exists to increase the battery life in various applications. By having multi-deck circuits that cleverly share rails, linear voltage regulators can become more efficient and hence reduce power consumption. Inefficient DC-DC converters and associated components can be avoided. Further, leakage current can be reduced and/or alleviated.

The present disclosure is directed to a multi-deck circuit arrangement including a first deck having a first negative supply terminal and a second deck having a positive supply terminal connected to the first negative supply terminal. A single power supply provides voltage to the first and second deck, In one embodiment, the first deck and the second deck have similar supply impedance and, thus, equalize the supply voltage to each deck. The multi-deck circuit arrangement may also include a voltage regulator circuit to adjust the voltage on the second positive supply terminal dynamically in order to reduce overall power consumption.

The subject technology also provides for component body terminal connections to reduce leakage current such as source-drain leakage current. In one embodiment, the body terminal of a PMOS transistor in one circuit or deck is connected to a positive supply of a higher deck to reduce the leakage current. Similarly, the body terminal of a NMOS transistor in one deck is connected to a negative supply of a lower deck to reduce the leakage current.

The present disclosure also teaches avoiding using level shifting between circuits by arranging decks so that a first threshold of a first deck aligns with a second threshold of a second deck that has a higher supply voltage requirement so that a level shifter between the decks is not required.

The subject technology also illustrates how to provide voltage regulation using parallel dump circuits. The dump circuits can consume energy for the voltage regulation of the decks and perform additional useful function(s). Such dump circuits simplify and improve upon circuit design by alleviating the need for pass transistors in series. The present disclosure is also directed to a digital regulator in which the current is dumped through digital circuits. The digital regulator can be interleaved with a regulated circuit. Thus, the dump circuit, used to regulate the supply, is integrated within the circuit whose supply is being regulated. Additionally, the dump circuit can perform a useful function such as a true random number generator.

The subject technology can also have voltage regulation in which the deck voltages are contained within a range of voltages rather than being steered to a single target value. Thus, there are periods in which neither an upper current dump nor the lower current dump for a particular supply rail is active to reduce the consumed power.

Another embodiment of the subject disclosure is dynamic trade-off of supply voltages between decks by adjusting the supply voltage of one deck for the benefit of other decks in the circuit arrangement. For example, higher voltage can yield faster performance and lower leakage. Lower voltage can yield lower dynamic power.

Further, deck voltage level alignment is provided by arranging the decks so that the thresholds of one deck align with the threshold of another deck that has a different supply voltage requirement. As a result, level shifters between the decks are not required. The deck voltages can also be aligned dynamically in order to align the voltage thresholds between the circuits.

The subject technology also provides the ability to equalize an adaptive voltage scaling (AVS) regulator. The AVS regulator adjusts the regulated supply voltage such that the currents of two or more decks are equalized to perform maximum useful work with minimal current dumping.

Any two or more of the features described in this specification, including in this summary section, may be combined to form implementations not specifically described in this specification.

At least part of the circuitry and processes described in this specification may be configured or controlled using a computing system comprised of one or more processing devices and memory storing instructions that are executable by the one or more processing devices to perform various control operations.

The details of one or more implementations are set forth in the accompanying drawings and the following description. Other features and advantages will be apparent from the description and drawings, and from the claims.

DETAILED DESCRIPTION

Described herein are examples of multi-deck circuit configurations or arrangements in which the negative supply voltage of one deck is used as the positive supply voltage of another deck. Example multi-deck circuitry includes a first circuit having a first positive supply terminal and a first negative supply terminal, and a second circuit having a second positive supply terminal and a second negative supply terminal. The first positive supply terminal is electrically connected to the second negative supply terminal. In this connection, the negative supply voltage for the first circuit is used as the positive supply voltage for the second circuit. The circuitry is powered by a voltage source having a positive terminal connected to the second positive terminal and a negative terminal connected to the first negative terminal, to power all of the circuitry in the multi-deck circuit configuration.

Multi-Deck Voltage Regulators

Figure 1:
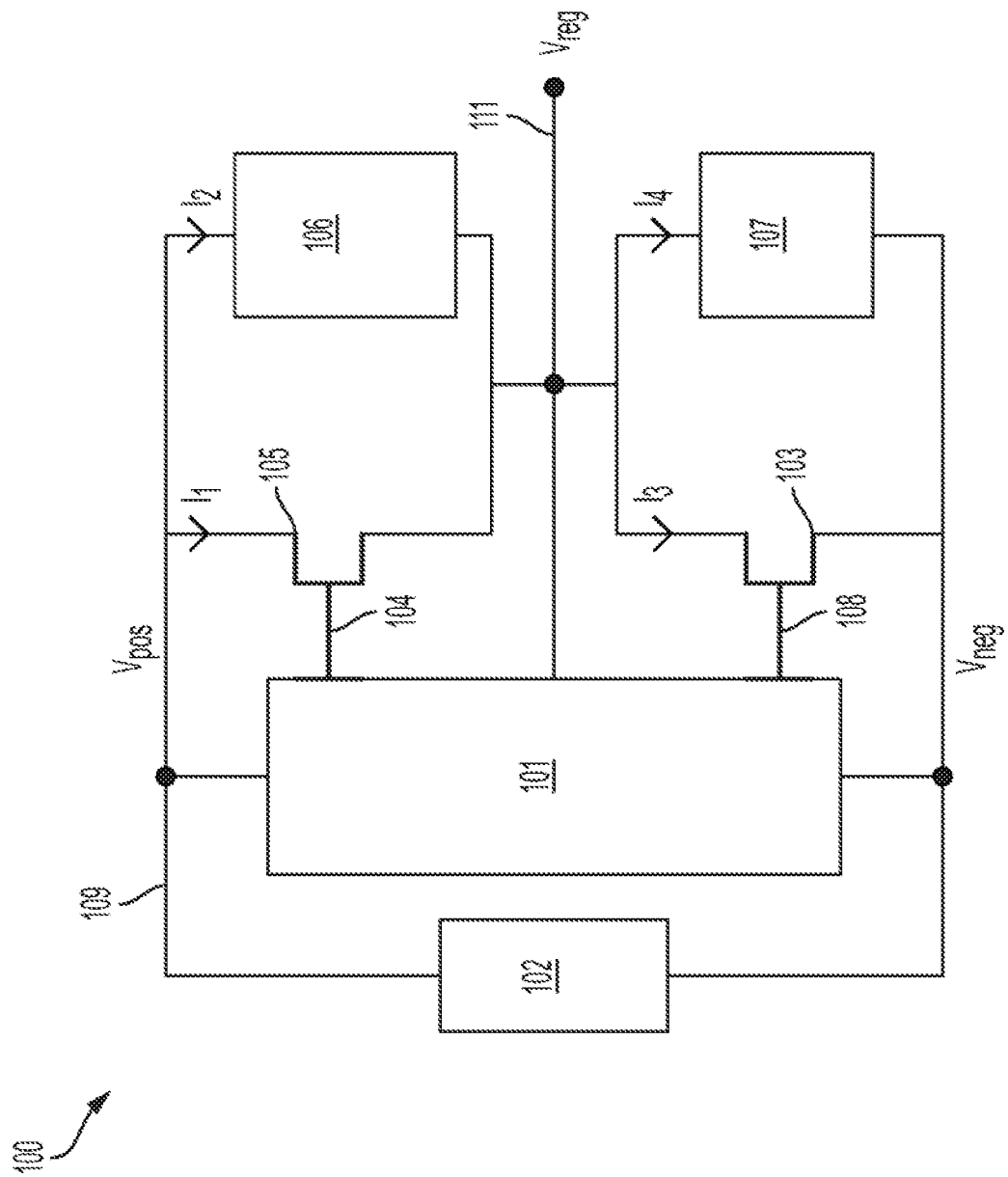
FIG. 1 is a block diagram showing an exemplary multi-deck circuit arrangement for providing voltage regulators in accordance with the subject technology.
Figure 7:
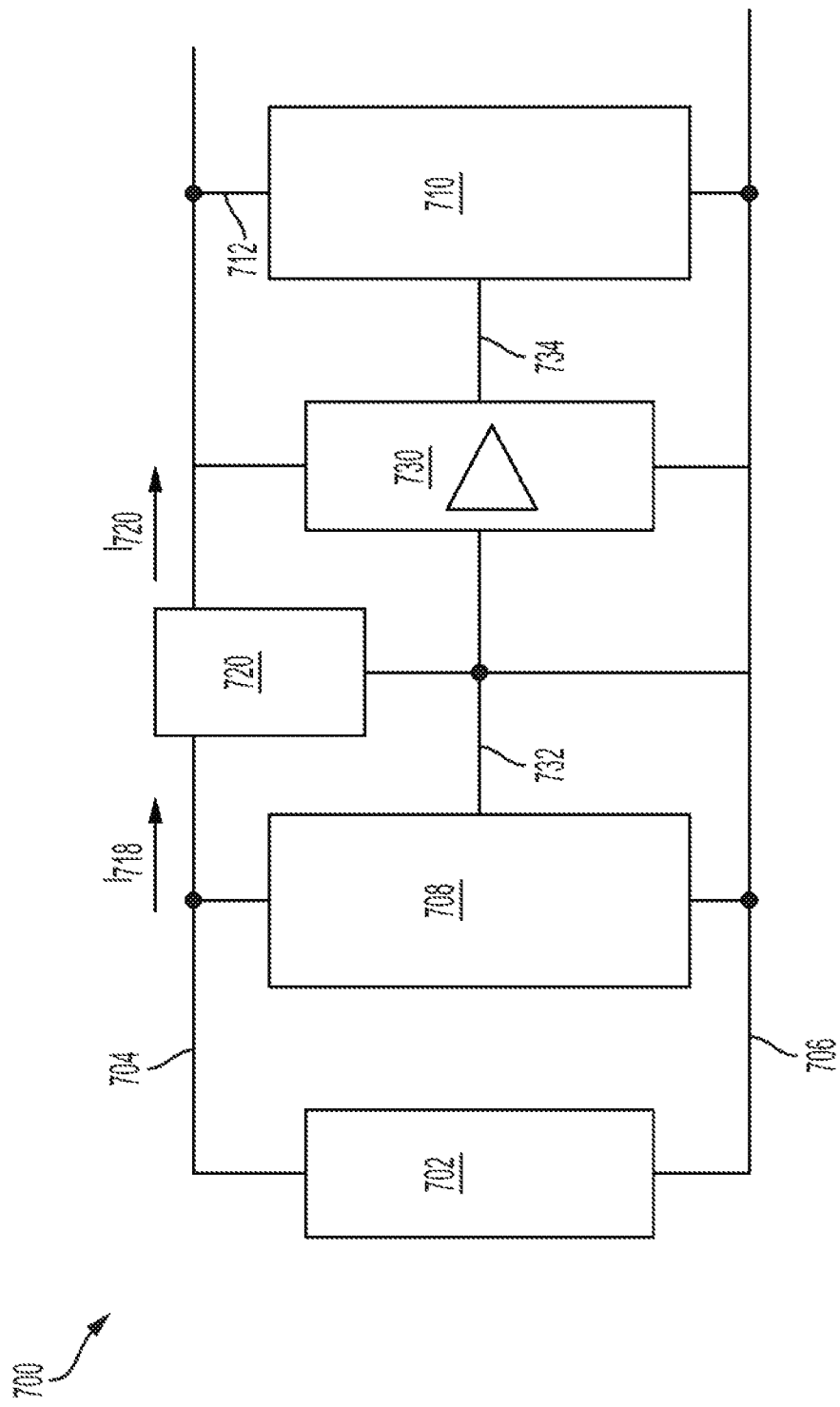
FIG. 7 illustrates a block diagram showing a traditional circuit arrangement for providing voltage regulation.

Referring to FIG. 1, a block diagram illustrates an exemplary multi-deck circuit arrangement 100 for providing voltage regulation without using a voltage regulator as shown in FIG. 7. The multi-deck circuit arrangement 100 improves upon the arrangement 700 of FIG. 7 by improving the overall circuit power consumption. The power supply 102 powers two circuits 106, 107. The circuits 106, 107 can be any of a variety of various circuits to accomplish the necessary functions for any device such as sensors, IoT devices and the like. The components may include any digital block, application specific, or generic purpose components. A voltage regulator 101 also connects to the positive supply terminal 109.

The multi-deck circuit arrangement 100 accomplishes voltage regulation of the supply 111 by controlling pass transistors 105 and 103, which are in parallel with the circuits 106 and 107 respectively. The voltage is regulated by using a signal on terminal 104 from the voltage regulator 101 to control the current $I_1$ through the pass transistor 105. The second pass transistor 103 is in parallel with the third circuit 107 so that the current $I_3$ of the second pass transistor 103 is also controlled by a signal on a second terminal 108 of the voltage regulator 101. In short, the regulation of the supply rail 111 is achieved by the voltage regulator 101 controlling the pass transistors 103, 105.

It is illustrative to view the pass transistors 105, 103 and circuits 106, 107 as having variable resistances rather than analyzing in terms of currents. For example, if the pass transistor 105 has a resistance of $R_1$, the circuit 106 has a resistance of $R_2$, the pass transistor 103 has a resistance of $R_3$, and the circuit 107 has a resistance of $R_4$, then using Ohm's law results in:

$$(V\text{pos}-V\text{reg})(1/R_1+1/R_2)=V\text{reg}(1/R_3+1/R_4)$$

Activity of circuits 106, 107 make $R_2$ and $R_4$ change. The voltage regulator 101 senses Vreg on terminal 111 in order to adjust $R_1$ and $R_3$ to keep Vreg within an interval. In this case, with two decks or circuits 306, 307, the target constant value of Vreg is likely to be Vpos/2.

Figure 2:
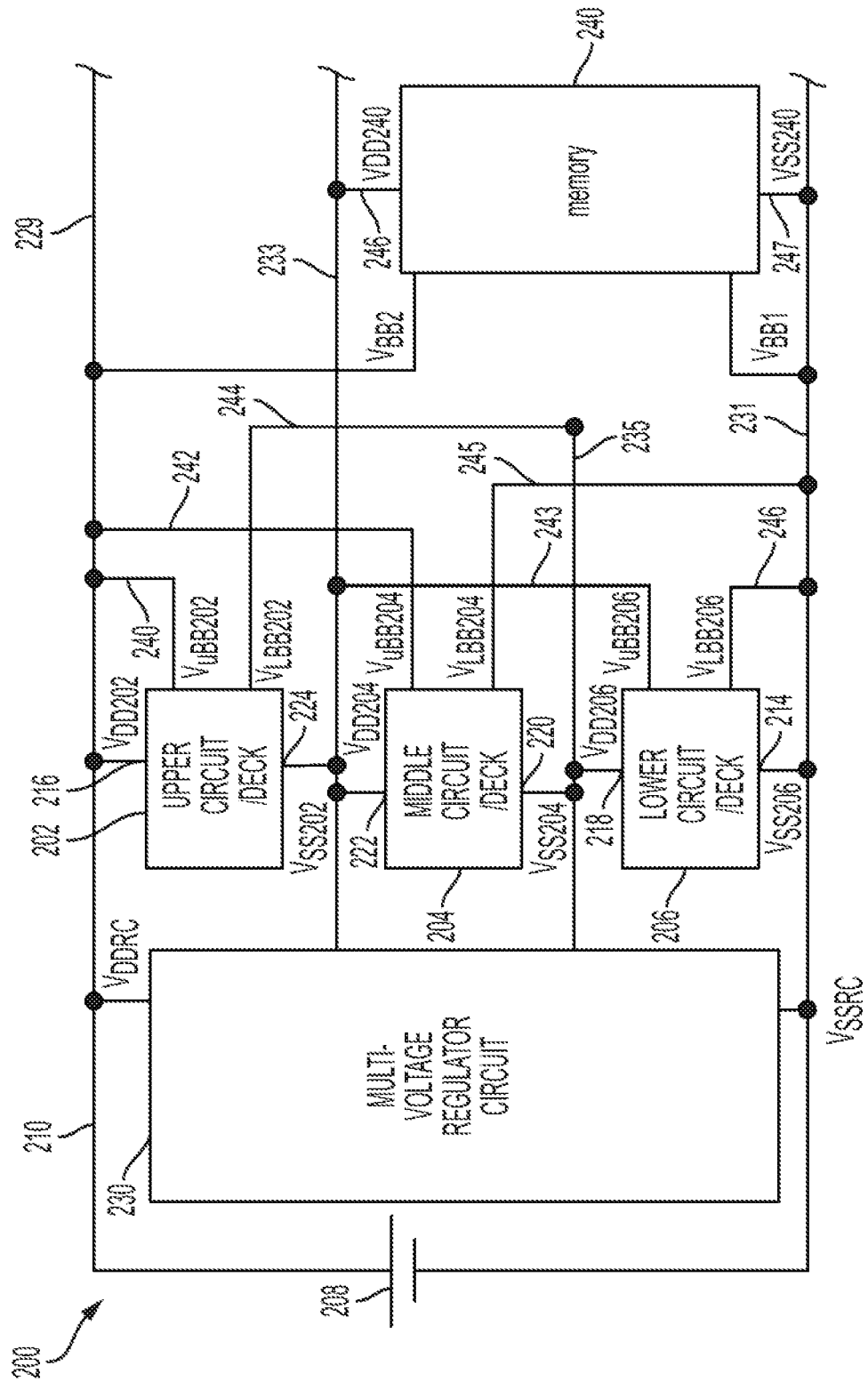
FIG. 2 is a block diagram showing example multi-deck circuitry containing three circuits arranged on three decks with another circuit spanning multiple decks.

FIG. 2 shows example circuitry that includes multi-deck circuitry 200 in accordance with the subject technology. In the example of FIG. 2, there are three separate decks or circuits 202, 204, and 206 and referred to as upper, middle, and lower circuits/decks, respectively. Each deck 202, 204, 206 has a positive supply terminal 216, 218, 222 and a negative supply terminal 214, 220, 224, respectively. Each deck 202, 204, 206 has a positive supply terminal 216, 218, 222 with a respective positive supply terminal voltage $VDD_{202}$, $VDD_{204}$, $VDD_{206}$ and a negative supply terminal voltage $V_{SS202}$, $V_{SS204}$, $V_{SS206}$ at respective negative supply terminals 214, 220, 224.

Although three decks are shown in FIG. 2, there may be fewer than three decks or more than three decks in a multi-deck circuit. The circuits may be analog or digital circuits built from a variety of components including field-effect transistors, complementary metal oxide semiconductors (CMOS), metal-oxide semiconductor field-effect transistor (MOSFET), capacitors, resistors and the like. The connections described herein may be direct or include intervening passive or active electronic devices such as wires (e.g., rails) or other components not shown for simplicity.

As shown in FIG. 2, a voltage source 208 includes terminals 210 and 212 connected to upper and lower rails 229, 231. The voltage source 208 generates a voltage difference across the terminals 210, 212 and, in turn, the rails 229, 231. The positive supply terminal 216 of upper deck 202 may connect directly to the terminal 210 or the upper rail 229. The negative supply terminal 214 of lower deck 206 may connect directly to the terminal 212 or the lower rail 231.

The negative supply terminal 224 of circuit 202 and the positive supply terminal 222 of circuit 204 are both connected to a first intermediate rail 233. Similarly, the negative supply terminal 220 of circuit 204 and the positive supply terminal 218 of circuit 206 are connected to a second intermediate rail 235.

The series connection of circuits 202, 204, and 206 in the example shown in FIG. 2 may need regulation of the intermediate supply voltages on the intermediate rails 233, 235 (e.g., the supply terminal voltages $V_{DD204}$, $V_{DD206}$ and the negative terminal voltages $V_{SS202}$, $V_{SS204}$) by a multi-deck voltage regulator circuit 230. The voltage regulator circuit 230 includes circuitry such as resistors, capacitors, and inductors for keeping the voltages across each deck 202, 204, 206 within specified limits. The voltage regulator circuit 230 connects to the rails 229, 231, 233, 235 and uses bypass and dump circuitry to accomplish the regulation of the voltages to ensure functionality. The voltage regulator circuit 230 is configured to adjust the intermediate voltages dynamically in order to ensure proper functionality of 202, 204, 206.

At various times, the voltage regulator circuit 230 may deactivate one or more of the circuits 202, 204, 206, for example to allow to enhance the performance of some circuits. For example, the voltage regulator circuit 230 can deactivate circuit 206 by shorting positive supply terminal 218 and negative supply terminal 214. As a result, the circuit 206 would consume little if any power. However, if the other two decks are on, the overall consumption is approximately the same.

Still referring to FIG. 2, each circuit 202, 204, 206 also has an upper and lower bulk body bias connection 240-246 to various rails 229, 231, 233, 235 for reducing leakage current. Each upper bulk body bias connection 240-243 has a respective voltage $V_{PBB202}$, $V_{PBB204}$, $V_{PBB206}$ that may be higher than the voltage supplied to the components of the respective circuit 202, 204, 206. And each lower bulk body bias connection 244-246 has a respective voltage $V_{LBB202}$, $V_{LBB204}$, $V_{LBB206}$ that may be lower than the voltage supplied to the components of the respective circuit 202, 204, 206. Thus by making various connections within the circuits 202, 204, 206 to the bulk body bias connections 240-246, leakage current can be eliminated or reduced.

For example, if the body terminal of a P-channel transistor is connected to a voltage that is higher than the supply voltage of the circuit, leakage current is eliminated or reduced. Additionally, the leakage current can be eliminated or reduced if the body terminal of an N-channel transistor is connected to a voltage reference that is lower than the negative voltage of the respective circuit. The leakage current can also be eliminated or reduced if both: (1) the body terminal of a P-channel transistor is connected to a voltage that is higher than the supply voltage; and (2) the body terminal of an N-channel transistor is connected to a voltage reference that is lower than the negative voltage of the circuit.

Still referring to FIG. 2, the circuitry 200 may also include another circuit 240 that operates at a higher supply than a single deck. As shown, the circuit 240 is a memory circuit, but many other types of functions could be formed by the circuit 240. The memory circuit 240 has terminals 246, 247 connected to rails 233, 231, respectively.

Figure 3:
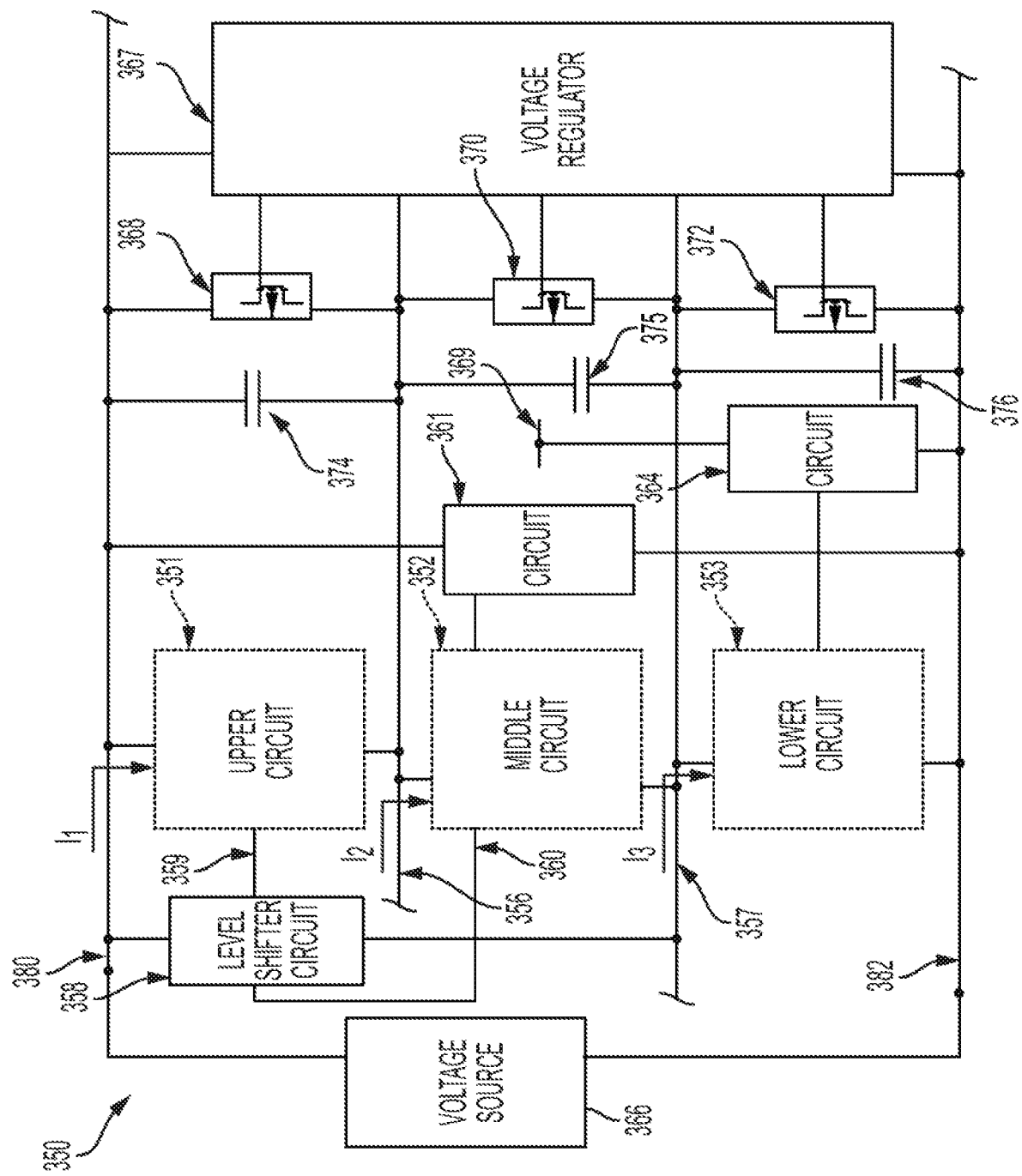
FIG. 3 is block diagram showing an example implementation of multi-deck circuitry containing three circuits arranged in three decks showing level shifting, decoupling capacitors, and circuits spanning deck but without level shifters.
Figure 4:
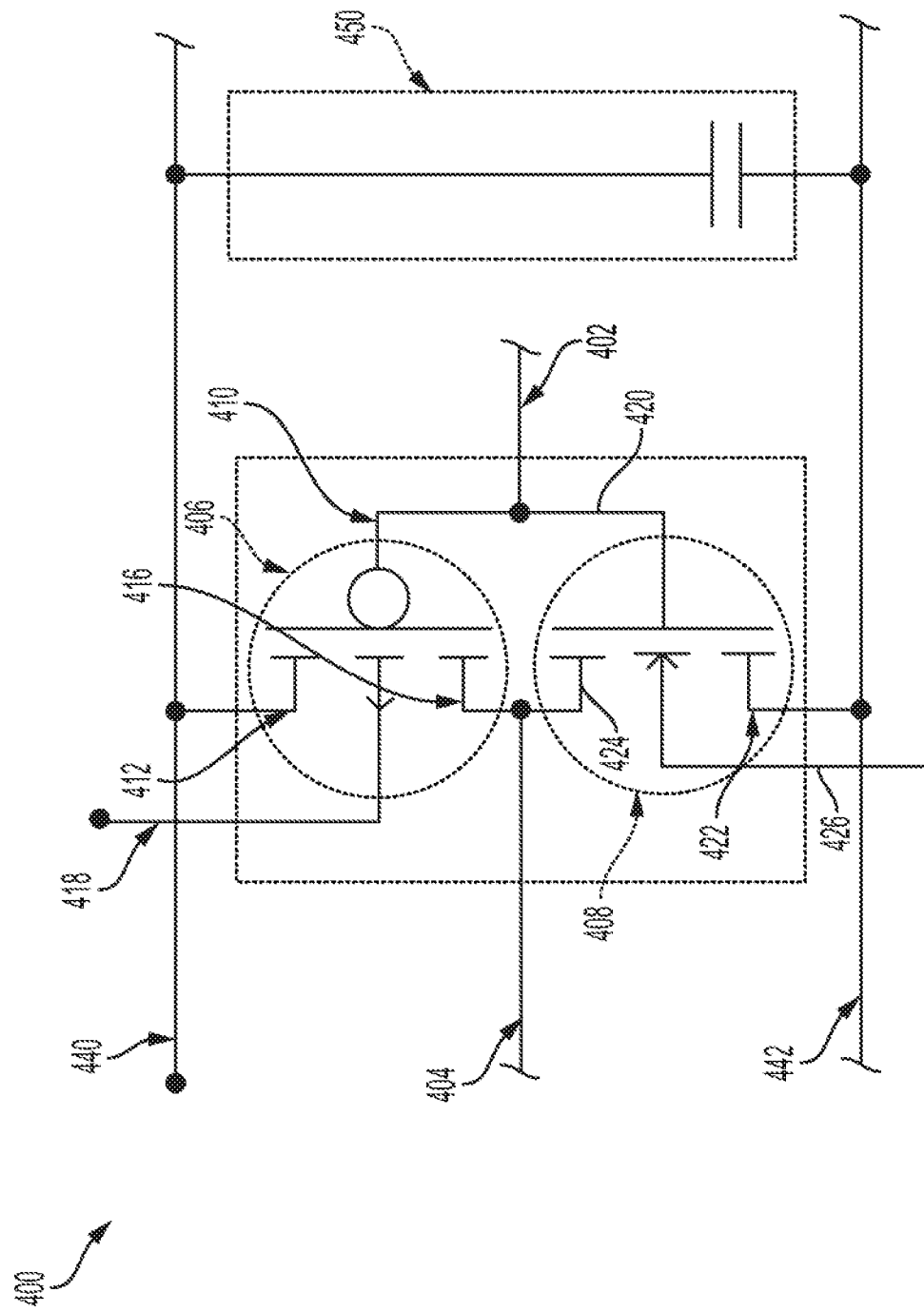
FIG. 4 is a circuit diagram showing complementary metal oxide semiconductor (CMOS) circuitry.

FIG. 3 shows an example implementation of multi-deck circuitry 350 having three separate decks or circuits 351, 352, 353 connected in series. In this regard, upper circuit 351, middle circuit 352, and lower circuit 353 may also be referred to herein as upper deck 351, middle deck 352, and lower deck 353, respectively. The multi-deck circuitry 350 is powered by a power source 366 having terminals 354, 355 connected to upper and lower rails 380, 382. In operation, power source 366 generates a voltage across terminals 354, 355.

The circuits 351-353 hang off the rail 380 as does as an optional voltage regulator 367 that generates intermediate voltages on intermediate rails 356, 357. The magnitudes or levels of the voltages provided to the intermediate rails 356, 357 may be determined based on predefined settings in the voltage regulator 367 or based on the signal activity of circuits 351-353 provided to the voltage regulator. The signal activity is typically from within the integrated circuit but may come from an outside source, such as a computer or other processing device. In the shown embodiment, the voltage regulator 367 adjusts the voltages on rails 356, 357 as a result of the current changes of circuits 351-353. In one embodiment, the voltages are rails 380, 356, 357 are 3v, 2V and 1V, respectively.

The voltage regulator 367 can also power down one or more of the circuits 351-353 using pass transistors 368, 370, 372. The pass transistor 363 connects to the rails 356, 380 and the voltage regulator 367, effectively in parallel with the upper circuit 351. Pass transistors 370, 372 are similarly connected for circuits 352, 353. Generally, the pass transistors 368, 370, 372 are controlled by an analog signal from the voltage regulator 367 to adjust the current passing therethrough as described below in more detail.

Each of the transistors 368, 370, 372 can also function as a switch. A pass transistor 368, 370, 372 being continuously "ON" effectively creates a short circuit between the respective rails (e.g., rails 356, 380 for pass transistor 368). As a result, pass transistor 368 would power down circuit 351. Shutting-down an individual circuit 351-353 can be beneficial in some instances. For example, shutting-down individual circuit 351 may allow circuits 352, 353 to operate at higher voltages, which may increase their speeds of operation. That is, the voltage that previously would have been allocated to circuit 351 may instead be distributed between circuits 352, 353, allowing those circuits to operate using greater voltage. Shutting-down an individual circuit 351-353 may also reduce the overall power consumption or allow running on higher voltage to reduce leakage current.

The voltage regulator 367 regulates voltages on voltage rails 356, 357 based on currents $I_1$, $I_2$ and $I_3$ flowing through circuits 351-353. The voltage regulator 367 senses the voltages on 356, 357 to balance or otherwise change the currents $I_1$, $I_2$ and $I_3$. In this regard, the pass transistors 368, 370, and 372 pass currents that correspond to differences between two of the currents $I_1$, $I_2$ and $I_3$ as part of the regulation process. For example, for a given interval of time when $I_1$ (i.e., the current through circuit 351) is larger than $I_2$ and $I_3$, the voltage regulator 367 transfers current $(I_1-I_2)$ through pass transistor 370 and current $(I_1-I_3)$ through pass transistor 372. As a result of this current balancing, power dissipated by circuits 351-353 may be substantially the same and thus the voltage across each circuit 351-353 is sufficiently stable.

As explained previously, the voltage regulator 367 may adjust the voltage within a range of voltages in order to balance the currents $I_1$, $I_2$ and $I_3$ through each circuit 351-353. The voltage regulator 367 may also adjust to take advantage of adaptive voltage scaling (AVS) techniques. In this regard, the speed at which a circuit is capable of functioning can be dependent on its supply voltage. AVS techniques can exploit this relationship and control the supply voltage to be equal to the minimum voltage (and power) required for the circuit to operate at a pre-defined speed. For example, increases in a circuit's supply voltage result in increases in the circuit's speed of operation. These increases have an effect on the circuit's power consumption. An example AVS technique includes a closed-loop dynamic power minimization process that adjusts the voltage supplied to a circuit to match that circuit's minimum required power consumption during operation.

A circuit's speed of operation or performance, and thus the power consumption of the circuit, can also be dynamically controlled using dynamic frequency scaling. Dynamic frequency scaling changes the circuit's input clock frequency, which may be controlled using a processing device such as a microprocessor that may be integrated with the voltage regulator 367. Using AVS, the circuit's supply voltage can be correspondingly adjusted; for example, the supply voltage can be decreased in order to reduce power consumption when operating at lower frequencies. This combination of AVS technique and dynamic frequency scaling may be referred to as dynamic voltage and frequency scaling (DVFS).

In some implementations, in lieu of pass transistors 368, 370, 372, the circuitry 350 may include digital logic gates or other components to regulate voltage. For example, the digital logic gates may be controlled to dump current in order to balance or otherwise change the voltage across the multi-deck circuitry 350. A circuit such as this may be referred to as a "current dump circuit" or simply "dump circuit". In some implementations, these digital logic gates can be integrated into the circuits 351-353. Distributing the digital logic gates in this manner may increase capacitance in the circuitry, may reduce the number of gates required to regulate voltage for that circuit, and may reduce the leakage current in the circuitry. The dump circuitry may also serve a useful function. For example, a dump circuit may be a true random number generator (TRNG). A TRNG can generate random numbers using a physical process, which could benefit from the varied input thereto.

Still referring to FIG. 3, the multi-deck circuitry 350 includes an example level shifter circuit 358 hanging between rails 357, 380. The level shifter circuit 358 may be used shift signal voltage levels up so that a signal 360 from circuit 352 can be communicated to circuit 351 via signal 359. In a different embodiment, a level shifter may be used to shift a signal voltage down from circuit 351 to circuit 352.

In some implementations, multi-deck circuitry 350 also includes one or more circuits, such as circuits 361, 364 that communicate with circuits 351-353. For example, circuit 361 is connected to circuit 352 and circuit 364 is connected to circuit 353. Circuit 361 hangs off rail 380 but circuit 364 has a positive supply terminal 369 otherwise connected. Examples of circuits of this type include memory (e.g., RAM or flash non-volatile memory) and the like. In this example, circuit 364 is configured to use a higher positive supply voltage at terminal 369 than circuit 353. In this example, there will be no need to have level shifters for signals passing from deck 352 to circuit 361 because their voltage thresholds will be compatible.

Level shifters may be avoided by advantageously, by dynamically changing the voltage of intermediate supply rails 356, 357. For example, if voltage source 366 provides a 3V supply on 380 and circuit 354 is powered by some 1.5V supply 369, signal voltage levels between circuit 364 and deck 353 will not be compatible. However, if deck 351 is powered off because pass transistor 368 shorts rails 380 and 356, the supply voltage on rail 357 will then be 1.5V rather than 1V and hence signal voltage levels between circuit 364 and deck 353 will be brought into alignment.

Also included in multi-deck circuitry 350 are capacitors 374-376 connected between the rails 380, 356, 357, 382. Capacitors 374-376 or parasitic capacitance may be configured as shown to eliminate or to reduce voltage transients and to maintain voltage differences between the various voltage rails. In short, the capacitors 374-376 are decoupling capacitance to smooth out fluctuations in the supply voltages on the rails 380, 356, 357.

Benefits of the multi-deck circuitry 350 include improved energy efficiency and/or reductions in implementation cost. For example in the multi-deck circuitry 350, the voltage source 366 may be a battery to provide a maximum voltage of $V_{BAT}$. The three circuits 351-353 operate at voltages of $Vcc=V_{BAT}/3$, resulting in drawing currents $I_1$, $I_2$, $I_3$ through circuits 351-353. The total power consumed is $V_{BAT}*\max(I_1, I_2, I_3)$ with voltage regulation being more simply and easily integrated. In contrast, a prior art circuit using a linear regulator to generate Vcc would consume a power of $V_{BAT}*(I_1+I_2+I_3)$. A prior art circuit using a DC-DC converter would consume a power of $V_{CC}*(I_1+I_2+I_3)/\eta$, where $\eta<1$ and would require considerable extra circuitry such as a large inductor or capacitor, which would be difficult to integrate into an integrated circuit.

Figure 5:
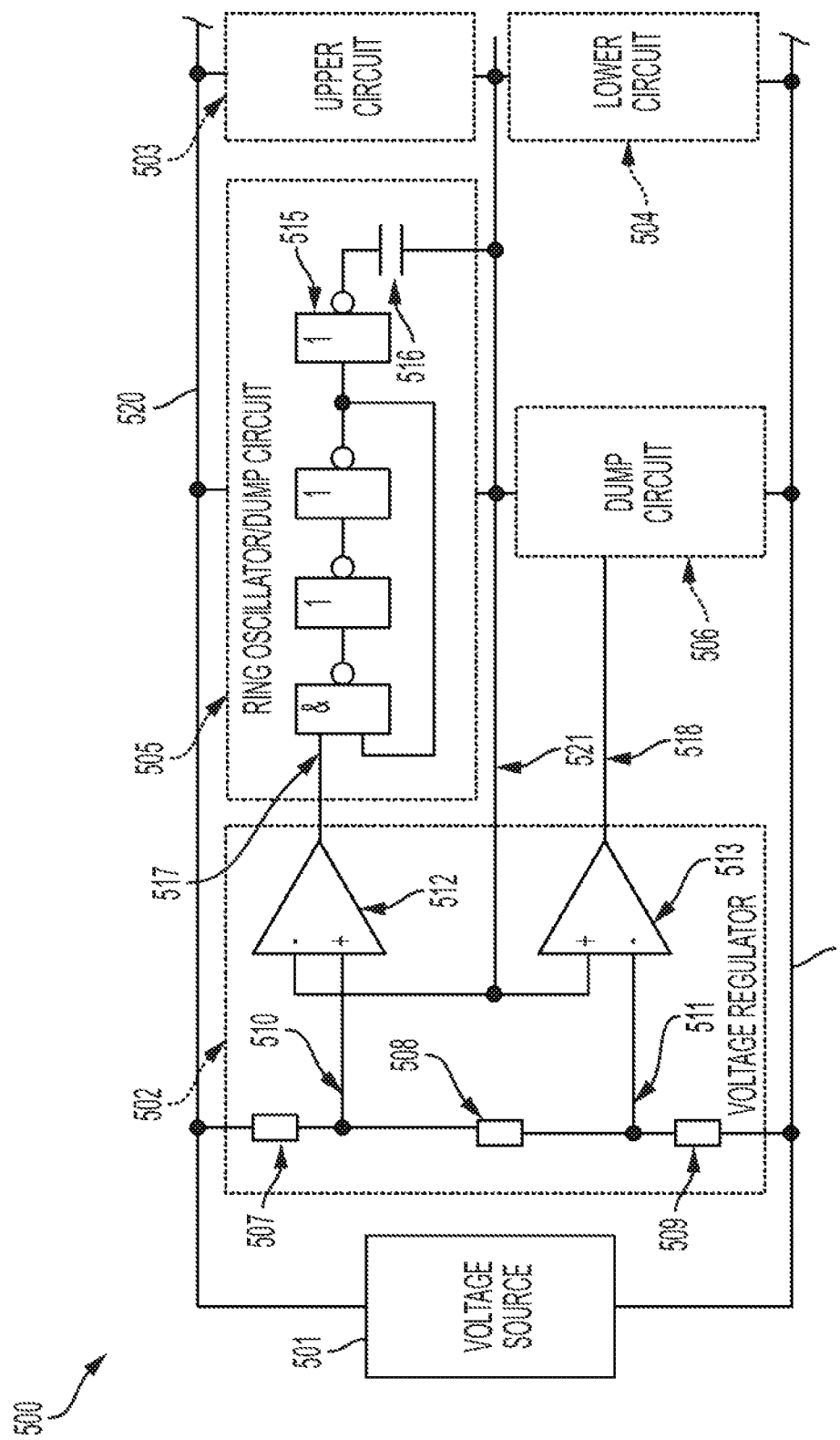
FIG. 5 is block diagram showing an example implementation of multi-deck circuitry containing two circuits arranged in two decks using a digital circuit to dump current.
Figure 6:
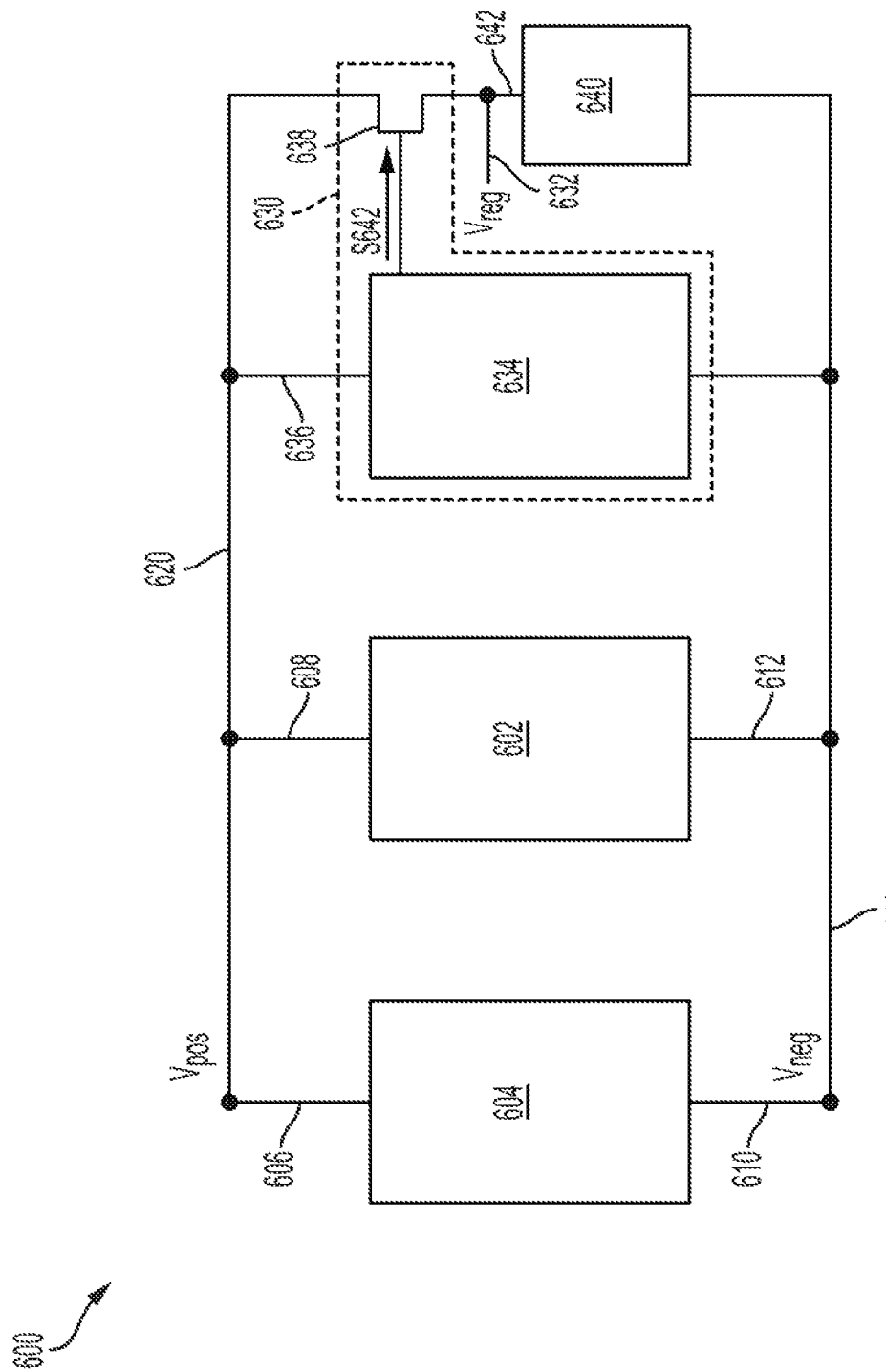
FIG. 6 illustrates traditional single deck circuit arrangement somewhat schematically.

FIG. 5 shows another multi-deck circuitry 500 having just an upper circuit 503 and a lower circuit 504 connected between rails 520, 522. The circuits 503, 504 are powered by a voltage source 501. Both circuits 503, 504 connect to an intermediate rail 521. An optional first dump circuit 505 is connected in parallel with the circuit 503 and a second optional dump circuit 506 is connected in parallel with the circuit 504. Each dump circuit 505, 506 may be integrated into the respective circuit 503, 504.

A voltage regulator 502 has connections 517, 518 to the dump circuits 505, 506 to provide control signals thereto in order to regulate the voltage on the intermediate rail 521. The voltage regulator 502 includes low-current voltage ladders 507-509 to generate voltages on connections 510, 511 for comparators 512, 513. Voltage ladders 507-509 may be implemented using resistors or other appropriate active or passive devices. The comparators 512, 513 compare the voltage on the intermediate rail 521 to the output of the ladders 507-509 to control the output signals on connections 517, 518. As a result, there will be periods when both dump circuits 505, 506 are disabled in which case the voltage regulator 502 will be momentarily nearly 100% efficient but for possible leakage via the resistors.

In one embodiment, the voltage regulator 502 adjusts voltages within a range rather than trying to maintain precise target values. By adjusting the output signals on connections 517, 518, the voltage across rails 520, 521 and the voltage across rails 521, 522 are maintained to control how much current flows through the dump circuits 505, 506. Such adjustments will balance out the currents consumed by each circuit 503, 504 as there is a relationship between circuit voltage and circuit current consumed. The need to dump current into other circuits would be reduced. There will be periods when neither circuit 505 nor circuit 506 are dumping current, thus saving power. The relationship between voltage across circuits 503, 504 and current through circuits 503, 504 is weak but voltage on connections 517, 518 can control the voltage across the circuits 503, 504 by means of the dump circuits 505, 506.

Voltage adjustments can be used very advantageously if combined with Adaptive Voltage Scaling techniques in which increasing a circuit's supply voltage will increase the frequency of operation and have a larger effect on the respective power consumption.

The dump circuits 505, 506 may perform useful functions given the limitation that the available energy to perform such function will be variable. In one embodiment, the first dump circuit 505 is a digital ring oscillator. Additional components may be included within the ring oscillator in order to reduce variations in current drain when the ring oscillator is enabled. In a small ring oscillator, switching output signal 517 on may only result in a small amount of current through circuit 505, not enough to balance out the difference needed to regulate the voltage on rail 521. Hence, more current-consuming components may be added into circuit 505, including parasitic capacitance 516.

One exemplary purpose of the circuit 505 is a digitally-controlled current dump, to regulate the supply. The oscillator output would not be used. It is conceivable that the oscillator output could be used, where some clock of highly-variable frequency could be used (e.g., keep-awake clock). It could be used as the source clock of a TRNG for example.

In some implementations, the dump circuit 505 is integrated into the upper circuit 503. The second dump circuit 506 may be a TRNG. Circuits 505, 506 may be any variety of different functional circuits and even the same. Capacitor 516 is deliberate parasitic capacitance to increase the power consumption of circuits.

Figure 8:
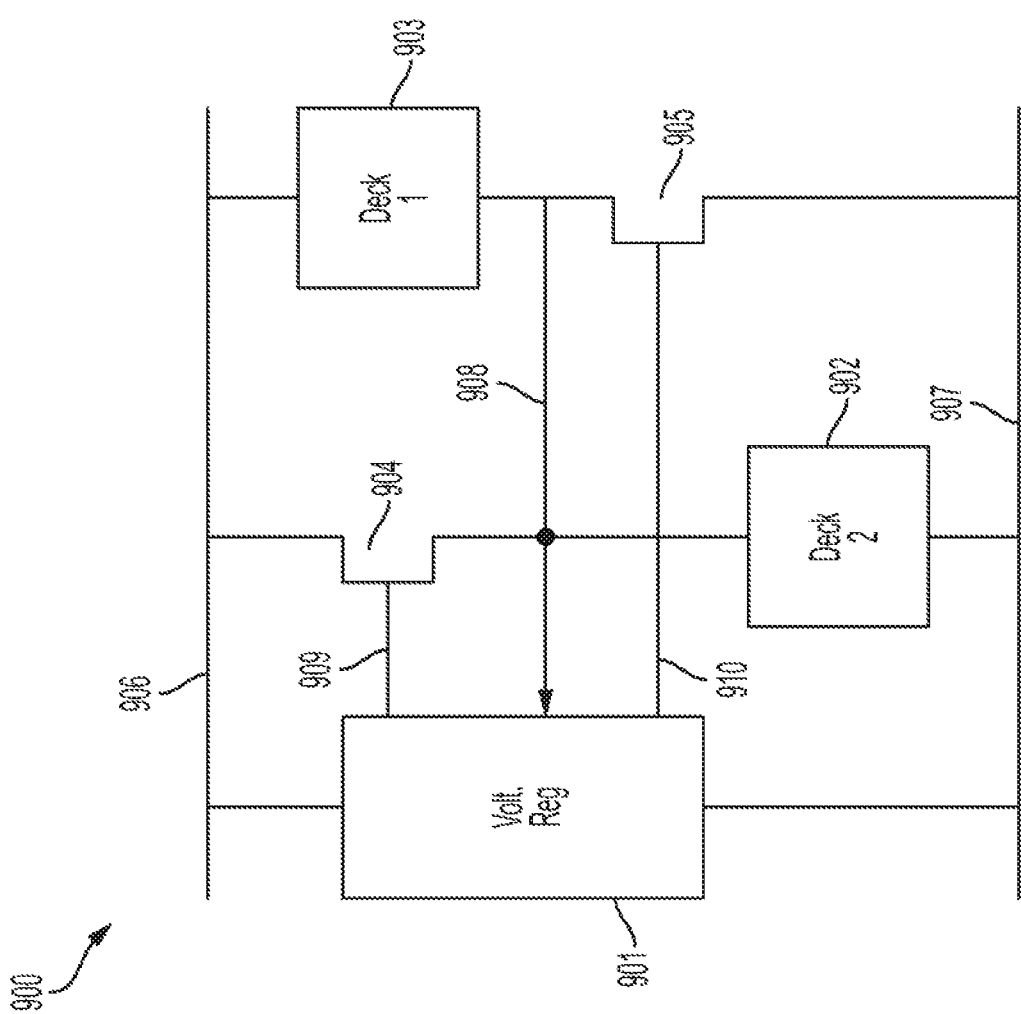
FIG. 8 illustrates a block diagram of a voltage regulator circuit.

Referring now to FIG. 8, a circuit 900 is shown with a linear voltage regulator 901 that senses a line 908 and adjusts an output connection 909 to modify current to a pass transistor 904 in order to have constant voltage on line 908 for circuit 902. The power dissipated in 904 is wasted. In principle, the voltage regulation could be done 'upside down': line 910 instead of output connection 909; transistor 905 instead of transistor 904; and deck 903 instead of deck 902. The subject technology puts both 'normal' and 'upside down' circuits together as shown as well as generalizes to more than 2 decks.

Further, there are a number of extra possibilities that arise from the circuit 900. Some of the power dissipated in transistor 904 that was wasted is now instead dissipated in deck 903 doing useful work. Some of the power dissipated in transistor 905 is now instead dissipated in deck 902 doing useful work. Thus, the total power wasted is therefore less than if prior art was used. In another embodiment, voltage regulator 901 can be integrated with transistors 904, 905.

The technology described herein can be used in various types of circuits. For example, the technology is preferably used in circuits having with minimal connectivity between decks, which may reduce the need for, or the number of, level shifters required. Examples of these circuits include, but are not limited to, triple module redundancy (TMR) circuits, dual-core lock-step (DCLS) circuits, and cluster computing systems in which processing is shared among multiple processing devices.

The subject technology is particularly well suited where the power consumption is very low, and one wants to make the power consumption even lower with efficiency of voltage regulation then being a significant factor. Tire pressure monitor sensor systems are such an example by including one or more tire pressure sensors that detect the inflation level of one or more tires and communicate wirelessly with a central hub. The tire pressure monitoring system may warn the user when a tire is underinflated, for example. In an example, a tire pressure monitor sensor may be an ASIC that is battery operated and, therefore, it may be advantageous to reduce the power consumption of the tire pressure monitor sensor in order to prolong battery life. The technology described herein may be used to reduce the power consumption of a tire pressure monitor sensor. For example, circuitry in the tire pressure monitor sensor may be configured as a multi-deck circuit having a voltage regulator to control power consumption of the individual decks as described herein.

The technology described herein may also reduce overall circuit size and the need for circuitry to generate additional voltages to operate components. For example, the voltage regulation techniques may eliminate the need for additional voltage converters or other circuits. In addition, the voltage regulation described herein may also be used to accommodate the voltage requirements of such components.

Actions associated with configuring or controlling the circuitry described herein can be performed by one or more programmable processors executing one or more computer programs to control all or some of the operations described herein. The circuitry can be configured or controlled by special purpose logic circuitry, such as, an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks. Non-transitory machine-readable storage media suitable for embodying computer program instructions and data include all forms of non-volatile storage area, including by way of example, semiconductor storage area devices, such as EPROM (erasable programmable read-only memory), EEPROM (electrically erasable programmable read-only memory), and flash storage area devices; magnetic disks, such as internal hard disks or removable disks; magneto-optical disks; and CD-ROM (compact disc read-only memory) and DVD-ROM (digital versatile disc read-only memory).

Any "electrical connection" as used herein may include a direct physical connection or an indirect connection that includes wired or wireless intervening components but that nevertheless allows electrical signals (including wireless signals) to flow between connected components. Any "connection" involving electrical circuitry mentioned herein through which electrical signals flow, unless stated otherwise, is an electrical connection and not necessarily a direct physical connection regardless of whether the word "electrical" is used to modify "connection".

Elements of different implementations described herein may be combined to form other implementations not specifically set forth above. Elements may be left out of the structures described herein without adversely affecting their operation. Furthermore, various separate elements may be combined into one or more individual elements to perform the functions described herein.

What is claimed is:

1. Circuitry comprising:
   a first circuit comprising a first positive supply terminal and a first negative supply terminal;
   a second circuit comprising a second voltage positive supply terminal and a second negative supply terminal, where the first negative supply terminal is electrically connected to the second positive supply terminal;
   a voltage source comprising a first terminal and a second terminal, the first terminal being connected electrically with the first positive supply terminal and the second terminal being connected electrically with the second negative supply terminal, the voltage source being configured to provide a voltage across the first terminal and the second terminal; and
   dump circuitry including a true random number generator, the dump circuitry configured to regulate a voltage across one or more of the first circuit and the second circuit.

2. The circuitry of claim 1, further comprising a voltage regulator configured to control an intermediate voltage between the first circuit and the second circuit, the intermediate voltage being connected electrically to the first negative supply terminal and to the second positive supply terminal.

3. The circuitry of claim 2, wherein the voltage regulator is configured to control the intermediate voltage by controlling currents flowing into the first and second circuits.

4. The circuitry of claim 2, wherein the voltage regulator is configured to control the intermediate voltage by gating one or more transistors to affect the currents flowing into the first and second circuits.

5. The circuitry of claim 2, wherein the voltage regulator is configured to control the intermediate voltage by controlling current dump circuits to affect the currents flowing into the first and second circuits.

6. The circuitry of claim 1, further comprising a third circuit comprising a third positive supply terminal and a third negative supply terminal, where the second negative supply terminal is connected to the third positive supply terminal, and where the second terminal is connected in series with the third negative supply terminal.

7. The circuitry of claim 1, wherein at least one of the first circuit or the second circuit comprises complementary metal oxide semiconductor (CMOS) circuitry, that is any CMOS circuit having one or more body terminals connected either to a voltage that exceeds the voltage of the positive supply terminal of the circuit or less than the voltage of the negative supply terminal of the circuit.

8. Circuitry comprising:
   a first circuit comprising a first positive supply terminal and a first negative supply terminal, the first circuit being configured to operate using a first voltage;
   a second circuit comprising a second positive supply terminal and a second negative supply terminal, where the first negative supply terminal is connected to the second positive supply terminal and the second circuit is configured to operate using a second voltage;
   a voltage regulator configured to regulate the first voltage and the second voltage by balancing current between the first circuit and second circuit;
   a voltage source comprising a first terminal and a second terminal, the first terminal being connected electrically with the first positive supply terminal and the second terminal being connected electrically with the second negative supply terminal, the voltage source being configured to provide a voltage across the first terminal and the second terminal; and
   dump circuitry including a true random number generator, the dump circuitry configured to regulate a voltage across one or more of the first circuit and the second circuit.

9. The circuitry of claim 8, further comprising a third circuit comprising a third positive supply terminal and a third negative supply terminal, where the second negative supply terminal is connected to the third positive supply terminal, and where the second terminal is connected with the third negative supply terminal.

10. The circuitry of claim 8, wherein the voltage regulator is configured to implement adaptive voltage scaling (AVS) to regulate the first voltage and the second voltage, wherein AVS comprises a closed-loop dynamic power minimization process that adjusts at least one of the first voltage or the second voltage to match minimum required circuit power consumption.

* * * * *